(12) United States Patent
Howard et al.

(10) Patent No.: US 11,575,211 B2
(45) Date of Patent: Feb. 7, 2023

(54) SYSTEM AND METHOD FOR SHIELDING ATTENUATION OF ELECTROMAGNETIC INTERFERENCE EMISSIONS

(71) Applicant: Rockwell Collins, Inc., Cedar Rapids, IA (US)

(72) Inventors: Sean D. Howard, Cedar Rapids, IA (US); Julie M. Byrd, Cedar Rapids, IA (US); Eric Stewart, Cedar Rapids, IA (US); Raymond Y. Zheng, Monterey Park, CA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 275 days.

(21) Appl. No.: 17/031,505

(22) Filed: Sep. 24, 2020

(65) Prior Publication Data

US 2022/0338343 A1 Oct. 20, 2022

(51) Int. Cl.
*H01Q 17/00* (2006.01)
*H05K 9/00* (2006.01)
*H05K 1/02* (2006.01)

(52) U.S. Cl.
CPC .......... *H01Q 17/00* (2013.01); *H05K 1/0218* (2013.01); *H05K 9/0007* (2013.01); *H05K 9/0039* (2013.01); *H05K 9/0081* (2013.01); *H05K 2201/0715* (2013.01)

(58) Field of Classification Search
CPC ..... H01Q 17/00; H05K 1/0218; H05K 9/0007
See application file for complete search history.

(56) References Cited

U.S. PATENT DOCUMENTS

| 5,570,270 | A | 10/1996 | Naedel et al. |
| 5,639,989 | A | 6/1997 | Higgins, III |
| 6,608,758 | B1 | 8/2003 | Hunt et al. |
| 6,756,932 | B1 * | 6/2004 | Barker ................ H01Q 17/00 342/4 |

(Continued)

FOREIGN PATENT DOCUMENTS

| CN | 110854546 A | 2/2020 |
| JP | H0864984 A | 3/1996 |
| KR | 100735759 B1 | 7/2007 |

OTHER PUBLICATIONS

Extended Search Report in European Application No. 21198977.7 dated Feb. 11, 2022, 13 pages.

(Continued)

*Primary Examiner* — Hung V Ngo
(74) *Attorney, Agent, or Firm* — Suiter Swantz pc llo (57) ABSTRACT

A printed circuit board (PCB) module may include a PCB with at least one internal PCB element and at least one external PCB element, a shielding layer fabricated from a tunable metamaterial absorber, and a structure housing the PCB. The at least one internal PCB element may be embedded between adjacent layers of the PCB. The at least one external PCB element may be coupled to an exterior surface of the PCB. The shielding layer may be tuned in response to the at least one measurement of the EMI emission and a determination of a frequency of the EMI emission from the at least one measurement. The tuning of the shielding layer may include adjusting a plurality of fins within a plurality of elements of the metamaterial absorber to absorb at least a portion of the EMI emission.

15 Claims, 11 Drawing Sheets

(56) References Cited

U.S. PATENT DOCUMENTS

| | | | |
|---|---|---|---|
| 7,245,507 | B2 | 7/2007 | DiBene et al. |
| 7,511,970 | B2 | 3/2009 | Justason et al. |
| 8,569,631 | B2 | 10/2013 | Doneker et al. |
| 9,245,854 | B2 | 1/2016 | Brodsky et al. |
| 9,832,915 | B2 | 11/2017 | Ball |
| 9,924,619 | B2 | 3/2018 | Kim et al. |
| 10,068,832 | B2 | 9/2018 | Han et al. |
| 10,172,265 | B2 | 1/2019 | Wrona et al. |
| 10,212,806 | B2 | 2/2019 | Dixon et al. |
| 10,264,666 | B2 | 4/2019 | Choi et al. |
| 10,455,738 | B2 | 10/2019 | Pakula et al. |
| 10,871,352 | B2 * | 12/2020 | Kante .................. F41H 3/02 |
| 2014/0008119 | A1 * | 1/2014 | Brandt ............... H05K 9/0007 |
| | | | 174/382 |
| 2017/0290209 | A1 | 10/2017 | Craig |
| 2021/0318369 | A1 * | 10/2021 | Rehammar .......... H01Q 17/008 |

OTHER PUBLICATIONS

Min Zhong et al: "Design and preparation of a single-band tunable metamaterial absorber in terahertz frequency", Physica Scripta, Institute of Physics Publishing, Bristol, GB, vol. 95, No. 5, Feb. 26, 2020 (Feb. 26, 2020), p. 55506, XP020353204, ISSN: 1402-4896, DOI: 10.1088/1402-4896/AB7681 [retrieved on Feb. 26, 2020].
Song Jianxun et al: "Graphene-based Tunable Terahertz Metamaterial Absorber with High Absorptivity", 2018 IEEE International Conference on Manipulation, Manufacturing and Measurement on the Nanoscale (3M-NANO), IEEE, Aug. 13, 2018 (Aug. 13, 2018), pp. 232-236, XP033458339, DOI: 10.1109/3M-NANO.2018.8552222[retrieved on Nov. 28, 2018].

* cited by examiner

SYSTEM AND METHOD FOR SHIELDING ATTENUATION OF ELECTROMAGNETIC INTERFERENCE EMISSIONS

BACKGROUND

Select avionics equipment may be designed for Electromagnetic Compatibility (EMC) to reduce Electromagnetic Interference (EMI). Testing for EMI may be costly to both a program requiring the select avionics equipment and to a company designing, manufacturing, and/or using the select avionics equipment. Designing for EMC may require costly calculations. Repurposing components with pre-designed EMC characteristics may require significant redesign and costs.

SUMMARY

A printed circuit board (PCB) module configured for shielding attenuation of an electromagnetic interference (EMI) emission is disclosed, in accordance with one or more embodiments of the disclosure. The PCB module may include a PCB with at least one internal PCB element and at least one external PCB element. The at least one internal PCB element may be embedded between adjacent layers of the PCB. The at least one external PCB element may be coupled to an exterior surface of the PCB. The PCB module may include a shielding layer fabricated from a tunable metamaterial absorber. The shielding layer may be tuned in response to at least one measurement of the EMI emission and a determination of a frequency of the EMI emission from the at least one measurement. The tuning of the shielding layer may include adjusting a plurality of fins within a plurality of elements of the metamaterial absorber. The shielding layer may be configured to absorb at least a portion of the EMI emission following the tuning of the shielding layer. The PCB module may include a structure housing the PCB.

In some embodiments, the metamaterial absorber may be coupled to an exterior surface of the structure.

In some embodiments, the metamaterial absorber may be tuned prior to being coupled to the exterior surface of the structure.

In some embodiments, the metamaterial absorber may be tuned after being coupled to the exterior surface of the structure.

In some embodiments, the metamaterial absorber may be coupled to an exterior surface of the structure during fabrication of the structure.

In some embodiments, the metamaterial absorber may be coupled to an interior surface of the structure.

In some embodiments, the metamaterial absorber may be tuned prior to being coupled to the interior surface of the structure.

In some embodiments, the metamaterial absorber may be tuned after being coupled to the interior surface of the structure.

In some embodiments, the metamaterial absorber may be coupled to an interior surface of the structure during fabrication of the structure.

In some embodiments, the metamaterial absorber may be coupled to an exterior surface of the PCB.

In some embodiments, the metamaterial absorber may be tuned prior to being coupled to the exterior surface of the PCB.

In some embodiments, the metamaterial absorber may be tuned after being coupled to the exterior surface of the PCB.

In some embodiments, the metamaterial absorber may be coupled to an exterior surface of the PCB during fabrication of the PCB.

A method is disclosed, in accordance with one or more embodiments of the disclosure. The method may include, but is not limited to, determining a frequency of an electromagnetic interference (EMI) emission emitted by a printed circuit board (PCB) module. The method may include, but is not limited to, tuning a shielding layer of the PCB module to attenuate the emitted EMI emission. The shielding layer may be fabricated from a tunable metamaterial absorber. The shielding layer may be tuned in response to at least one measurement of the EMI emission and a determination of a frequency of the EMI emission from the at least one measurement. The tuning of the shielding layer may include adjusting a plurality of fins within a plurality of elements of the metamaterial absorber. The tuned shielding layer may be configured to absorb at least a portion of the EMI emission following the tuning of the shielding layer.

In some embodiments, the method may further include, but is not limited to, coupling the shielding layer to the PCB module during fabrication of the PCB module.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION OF THE INVENTION

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

FIGS. 1A-5 generally illustrate a system and method for shielding attenuation of electromagnetic interference (EMI) emissions, in accordance with one or more embodiments of the disclosure.

Select avionics equipment may be designed for Electromagnetic Compatibility (EMC) to reduce Electromagnetic Interference (EMI). The EMI may emanate from the select avionics equipment. For example, EMI emissions may cause issues with outside components. By way of another example, EMI emissions may cause weaknesses in security protocols by allowing access to a device such as operating information.

Testing for EMI may be costly to both a program requiring the select avionics equipment and to a company designing, manufacturing, and/or using the select avionics equipment. For example, EMI tests may be difficult and costly for companies to pinpoint signal propagation from these devices. By way of another example, avionics labs may be setup to run EMI testing on a specific module such that only when testing has finished with the first module can testing begin on another, resulting in significant costs and delays when EMI testing needs to be done more than one time for a circuit board module.

Designing for EMC may require costly calculations on circuit board modules. Due to the unpredictability during the design process, initial EMC designs may have a high probability of failure, increasing costs and design time. Repurposing and retrofitting components (e.g., circuit boards or modules) with pre-designed EMC characteristics may require significant redesign and costs. In some cases where the components are being repurposed, inflexibility in the design (e.g., as necessary to main EMI characteristics) may mean the designs are not modifiable.

As such, it would be beneficial to have a system and method for shielding attenuation of module emissions. The system should be able to be included in a new design. The system should also be able to be incorporated into an existing design to allow for repurposing and/or retrofitting components for the purpose of shielding attenuation.

FIGS. 1A-2C generally illustrate a system 100 for testing for electromagnetic interference (EMI) emissions, in accordance with one or more embodiments of the disclosure. FIGS. 3A-3D generally illustrate example embodiments of a subsystem of one or more subsystems 102 within the system 100, in accordance with one or more embodiments of the disclosure.

The system 100 may include any stationary system. For example, the stationary system may include, but is not limited to, a structure or a sub-system configured to be attached to a structure. For instance, the structure may include, but is not limited to, a residential, commercial or industrial, or military establishment such as a home, a business, storage building, military building, or the like; a remote range device; or the like.

The system 100 may include any non-stationary system. For example, the non-stationary system may include, but is not limited to, a vehicle or a component configured to be attached to a vehicle. For instance, the vehicle may be any air, space, land, or water-based personal equipment or vehicle; any air, space, land, or water-based commercial or industrial equipment or vehicle; any air, space, land, or water-based military equipment or vehicle; or the like.

The one or more subsystems 102 may include, but are not limited to, one or more areas (e.g., pods, rooms, cabins, engine bays, defined cavities, or the like) within the system 100. By way of another example, the one or more subsystems 102 may include, but are not limited to, a module 102, one or more modules, one or more connectors of the one or more modules, one or more cables coupled to the one or more connectors of the one or more modules, or the like.

The system 100 may include one or more exterior subsystems 104 configured to receive an emitted electromagnetic interference (EMI) emission 106 from the one or more subsystems 102. For example, in a testing environment, the one or more exterior subsystems 104 may include, but are not limited to, a network analyzer. By way of another example, in an operating environment, the one or more exterior subsystems 104 may include, but are not limited to, exterior components 104 or devices capable of being disrupted or otherwise affected by the EMI emission 106. It is noted herein the receiving of the EMI emission 106 from the one or more subsystems 102 by the one or more exterior subsystems 104 may be intentional or unintentional with respect to the testing and/or operating of the one or more exterior subsystems 104.

A module 102 may be designed or retrofitted for electromagnetic compatibility (EMC) to dampen the EMI emission 106 to a reduced EMI emission 108. For example, the reduced EMI emission 108 may be of a significant magnitude of difference in terms of signal strength as compared to the EMI emission 106. Attenuating the EMI emission 106 may include reflecting or absorbing at least a portion of the EMI emission 106 back into the module 102. For example, the reflecting or absorbing of the EMI emission 106 back at a source of the EMI emission 106 may cause anti-resonance and ultimately negate the EMI emission 106.

Designing or retrofitting the module 102 for EMC may include adding one or more shielding layers 110 to a structure 200 of the module 102. The shielding layer 110 may reflect or absorb electromagnetic interference (EMI), acting as an EMI shield. For example, the EMI emission 106 emitted from inside the module 102 may be reflected or absorbed by the shielding layer 110, attenuating the EMI emission 106 such that only the reduced EMI emission 108 is emitted by the module 102. The shielding layer 110 may be configured to attenuate EMI emission 106 signal frequencies by absorbing the EMI emission 106 or reflecting the EMI emission 106 back at to the source (e.g., the one or more components 202), causing anti-resonance and ultimately negation of the EMI emission 106.

Figure 3A:
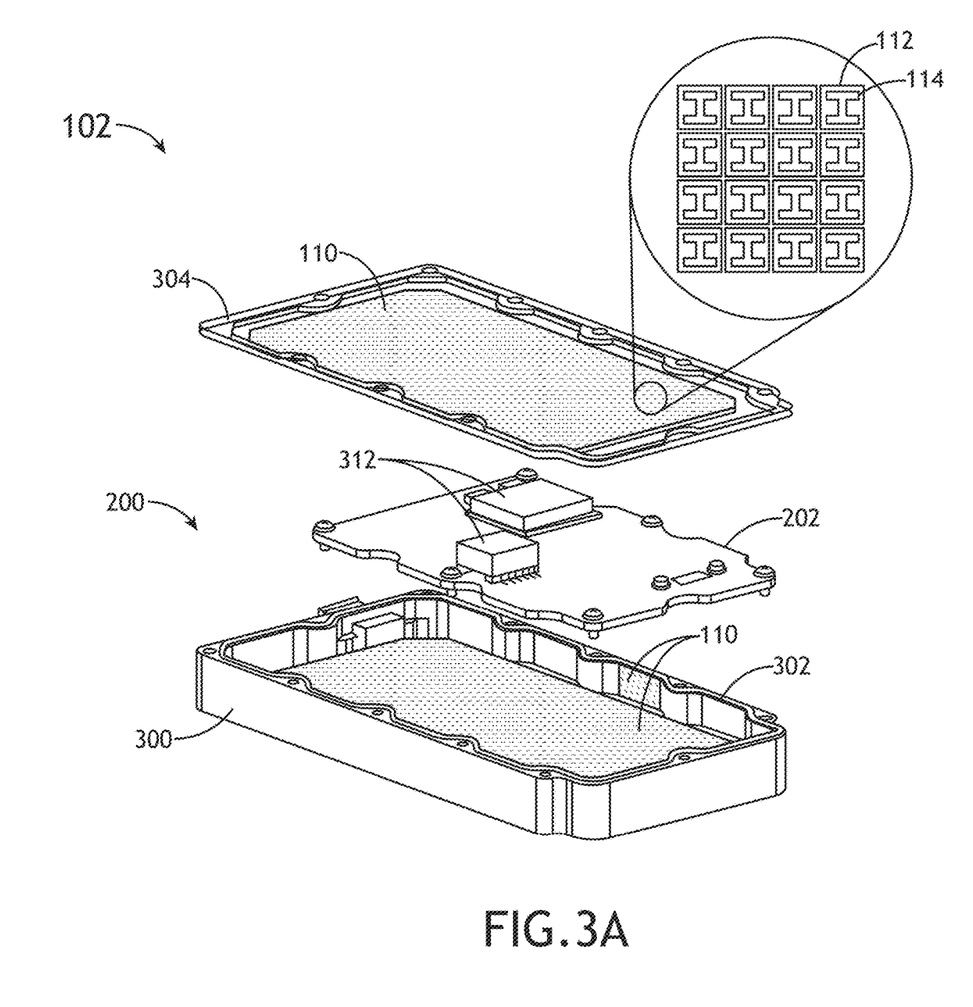
FIG. 3A is an exploded perspective view of a module including a metamaterial absorber for shielding attenuation of EMI emissions, in accordance with one or more embodiments of the disclosure.
Figure 3B:
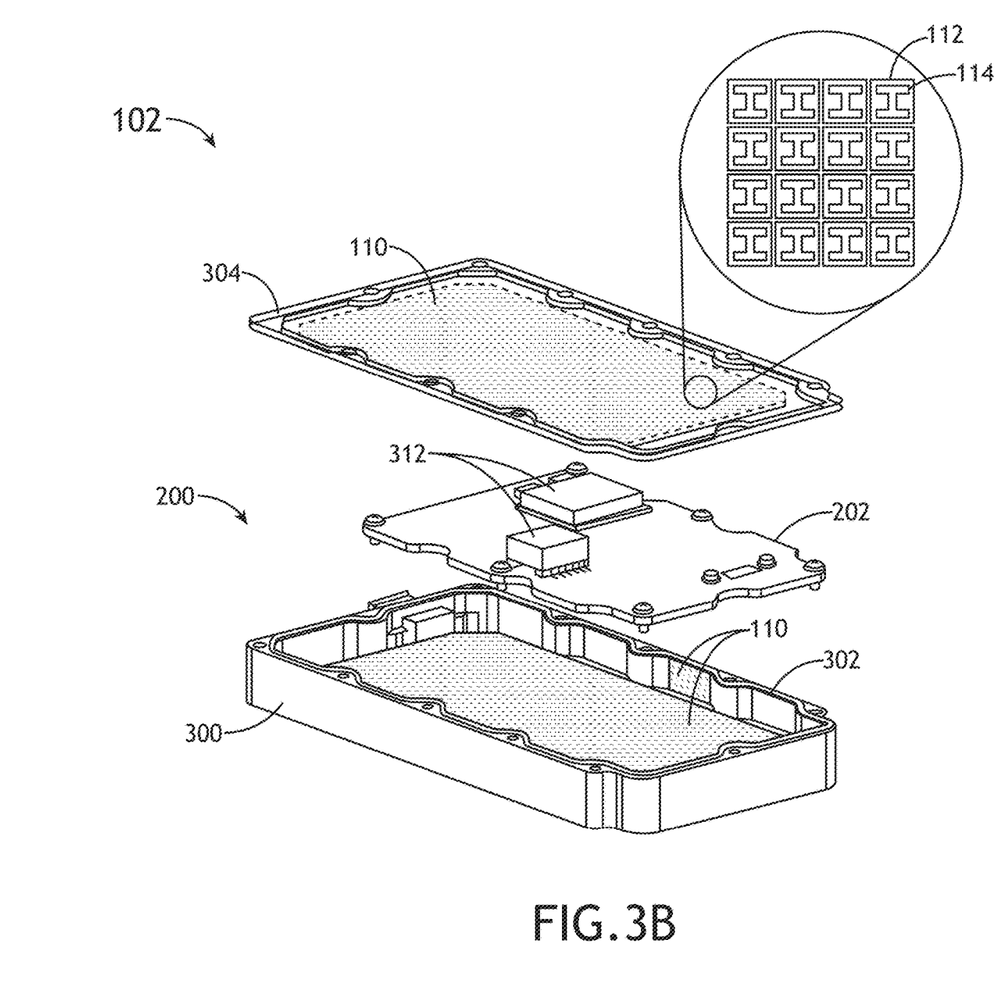
FIG. 3B is an exploded perspective view of a module including a metamaterial absorber for shielding attenuation of EMI emissions, in accordance with one or more embodiments of the disclosure.
Figure 3C:
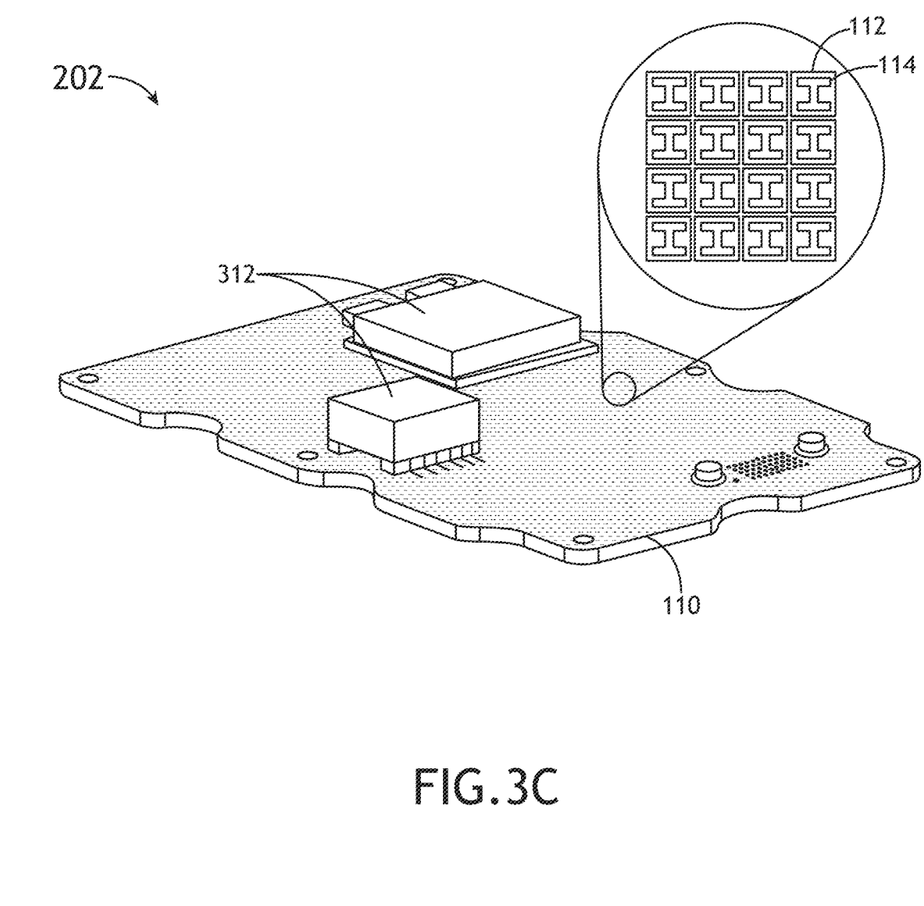
FIG. 3C is an exploded perspective view of a circuit card including a metamaterial absorber for shielding attenuation of EMI emissions, in accordance with one or more embodiments of the disclosure.
Figure 3D:
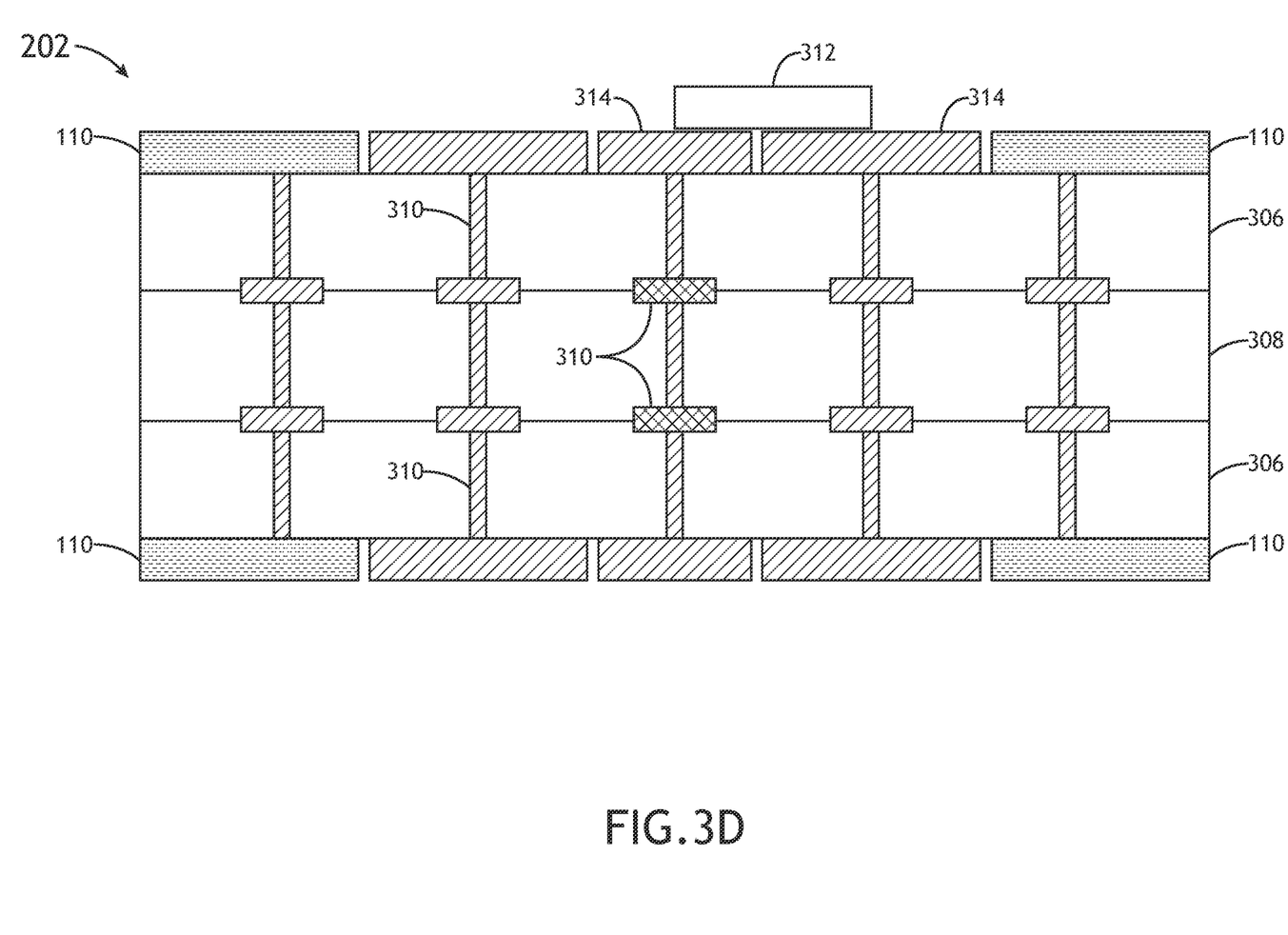
FIG. 3D is a simplified block diagram of a printed circuit board (PCB), in accordance with one or more embodiments of the disclosure.

The structure 200 may include a chassis, a housing, a shell, or other structure capable of encasing or encompassing at least a portion of the one or more subsystems 102 and/or at least some components of one or more components 202. The structure 200 may be fabricated with one or more portions. For example, as illustrated in FIGS. 3A-3C, the structure 200 may include a main body 300, sidewalls 302, and a lid 304. For instance, the sidewalls 302 may be integrated with the main body 300 during fabrication. In addition, the sidewalls 302 may be coupled to the main body 300 during fabrication. By way of another example, the structure 200 may be fabricated as a single integrated unit including the main body 300, the sidewalls 302, and the lid 304. It is noted herein the main body 300, the one or more sidewalls 302 and/or the lid 304 may be coupled via an adhesive, fasteners, soldering, or other coupling mechanism.

The shielding layer 110 may line an exterior of the structure 200 or an interior of the structure 200.

Figure 1A:
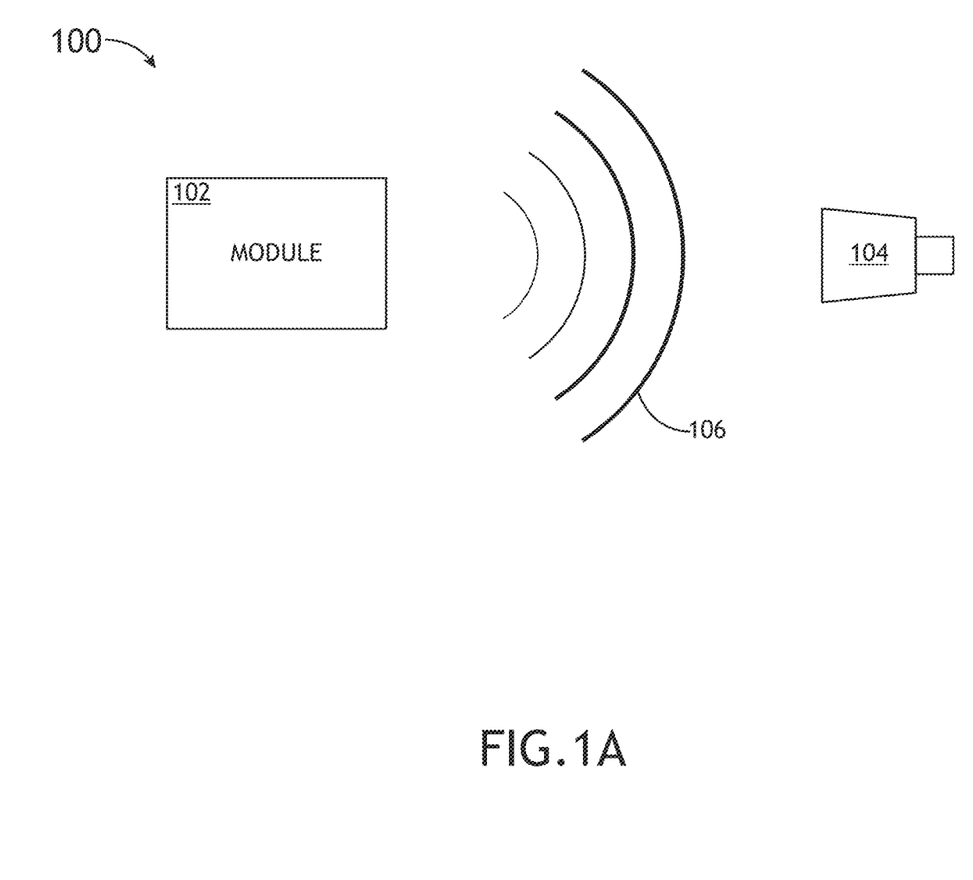
FIG. 1A is a simplified block diagram of a system for testing electromagnetic interference (EMI) emissions of a module, in accordance with one or more embodiments of the disclosure.
Figure 1B:
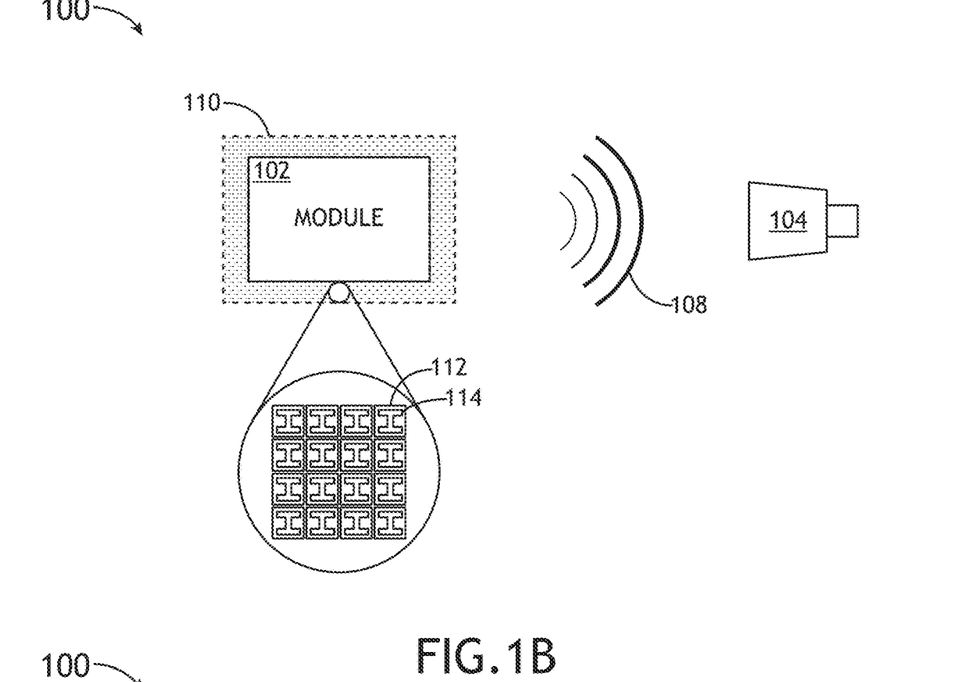
FIG. 1B is a simplified block diagram of a system for testing electromagnetic interference (EMI) emissions of a module including a metamaterial absorber for shielding attenuation of EMI emissions, in accordance with one or more embodiments of the disclosure.
Figure 2A:
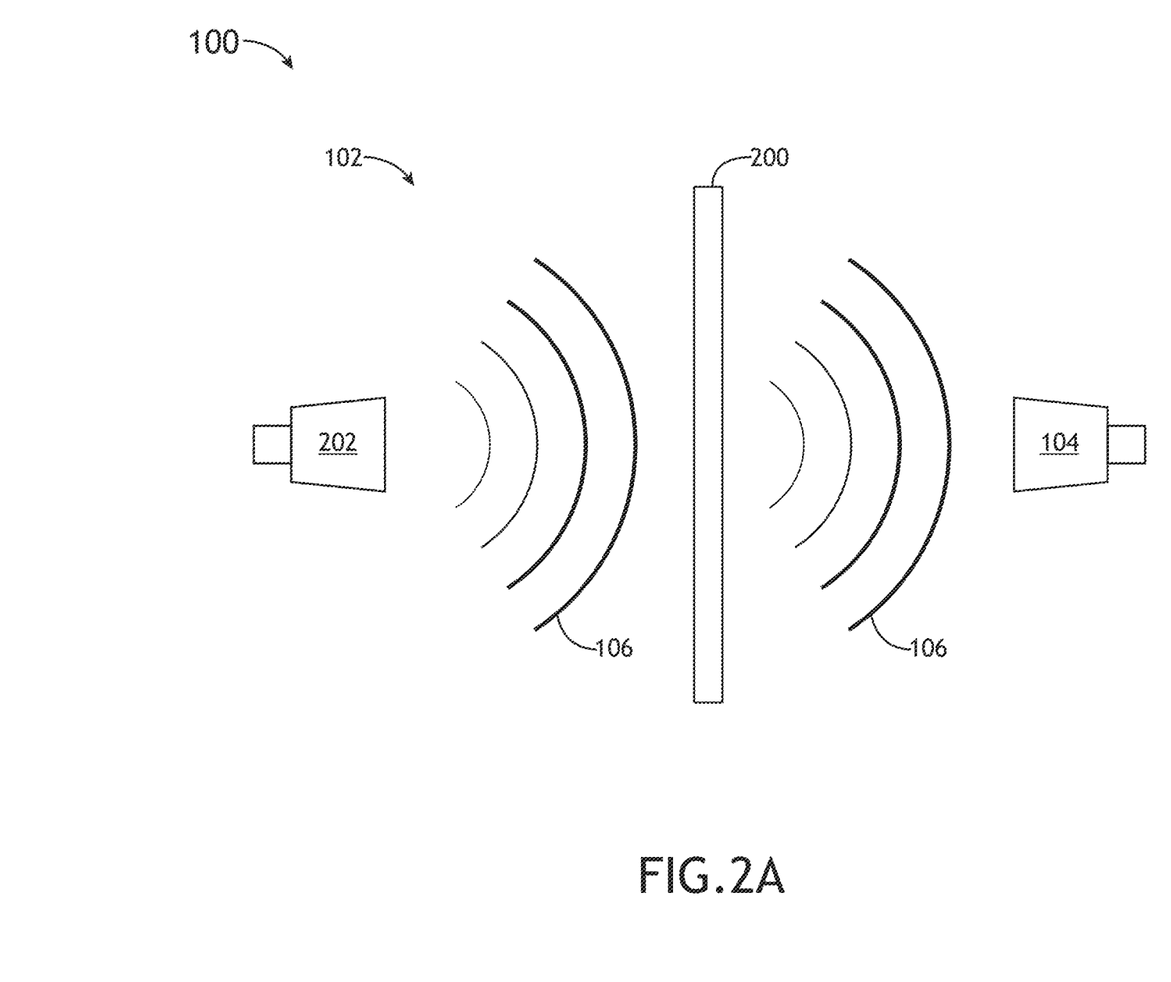
FIG. 2A is a simplified block diagram a system for testing electromagnetic interference (EMI) emissions of a circuit card, in accordance with one or more embodiments of the disclosure.
Figure 2B:
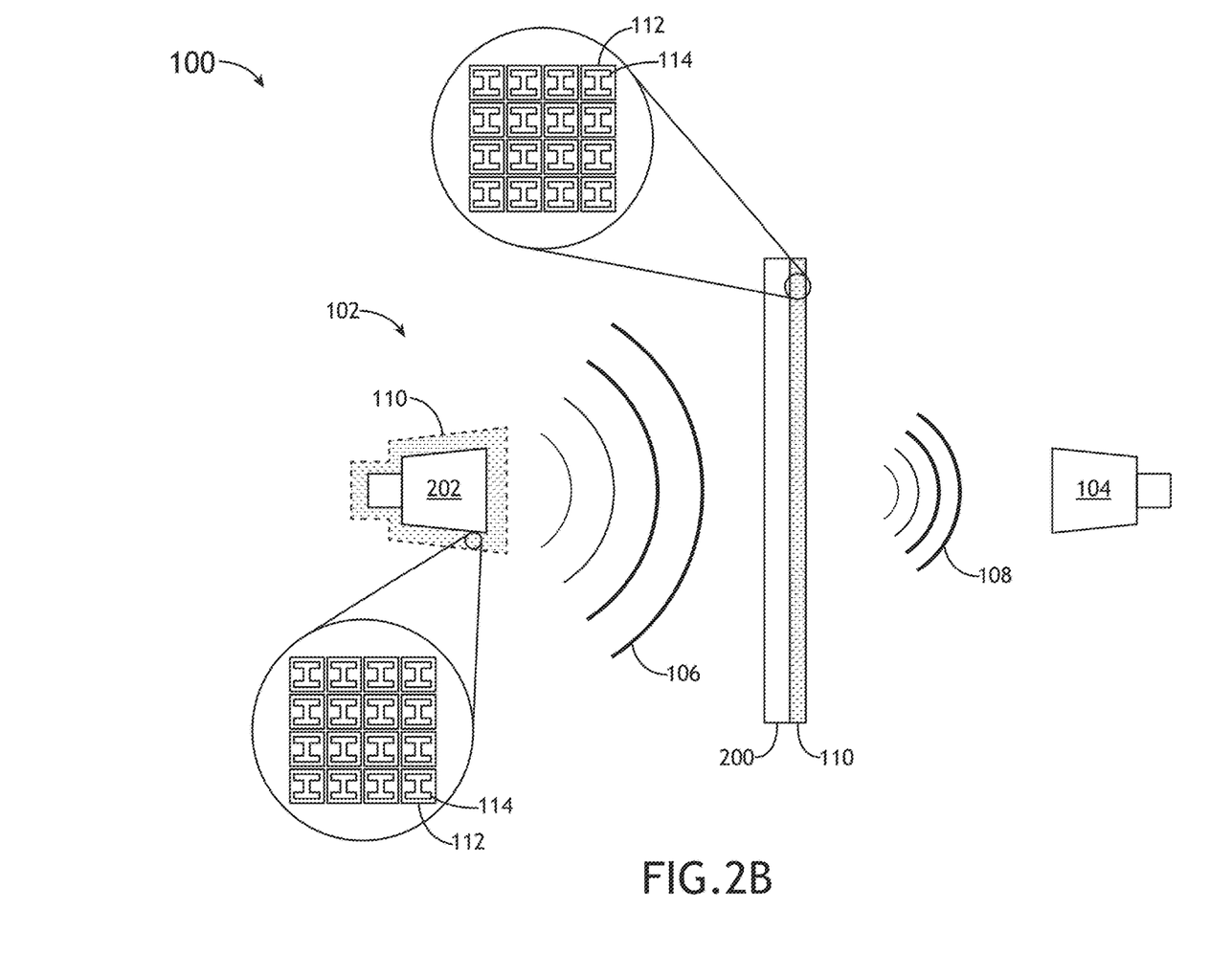
FIG. 2B is a simplified block diagram of a system for testing electromagnetic interference (EMI) emissions of a circuit card including a metamaterial absorber for shielding attenuation of EMI emissions, in accordance with one or more embodiments of the disclosure.

For example, as illustrated in FIGS. 1B, 2B, and 3A, the shielding layer 110 may be exterior to the module 102, such that the shielding layer 110 at least partially encases or encompasses the module 102. For instance, the shielding layer 110 may be coupled to an exterior surface of the main body 300, the sidewalls 302, and/or the lid 304 of the structure 200.

Figure 1C:
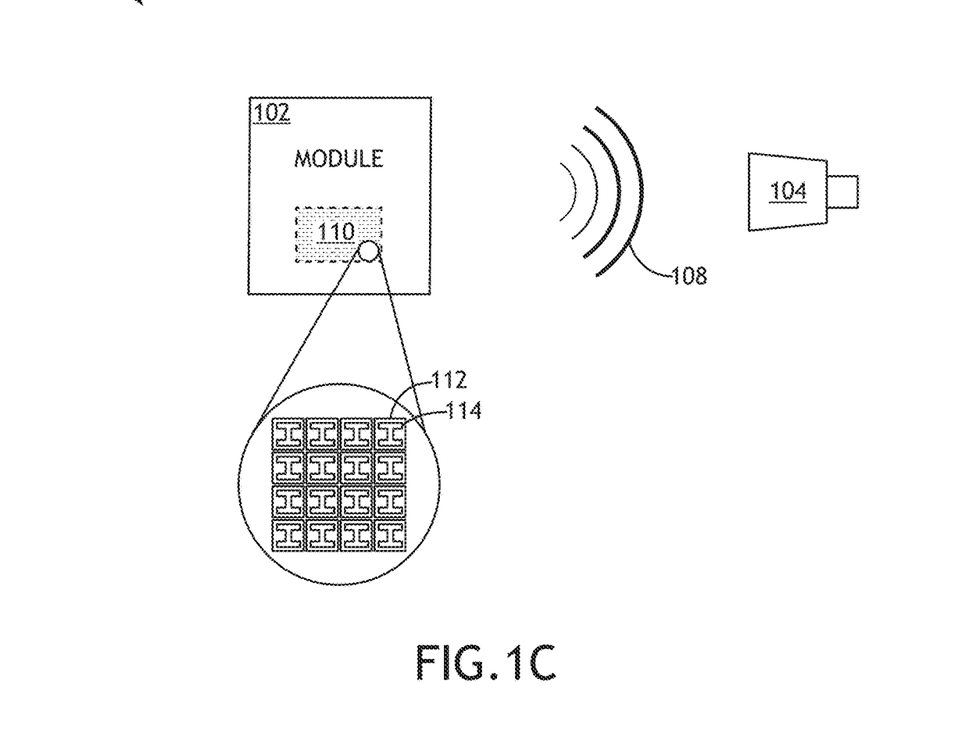
FIG. 1C is a simplified block diagram of a system for testing electromagnetic interference (EMI) emissions of a module including a metamaterial absorber for shielding attenuation of EMI emissions, in accordance with one or more embodiments of the disclosure.
Figure 2C:
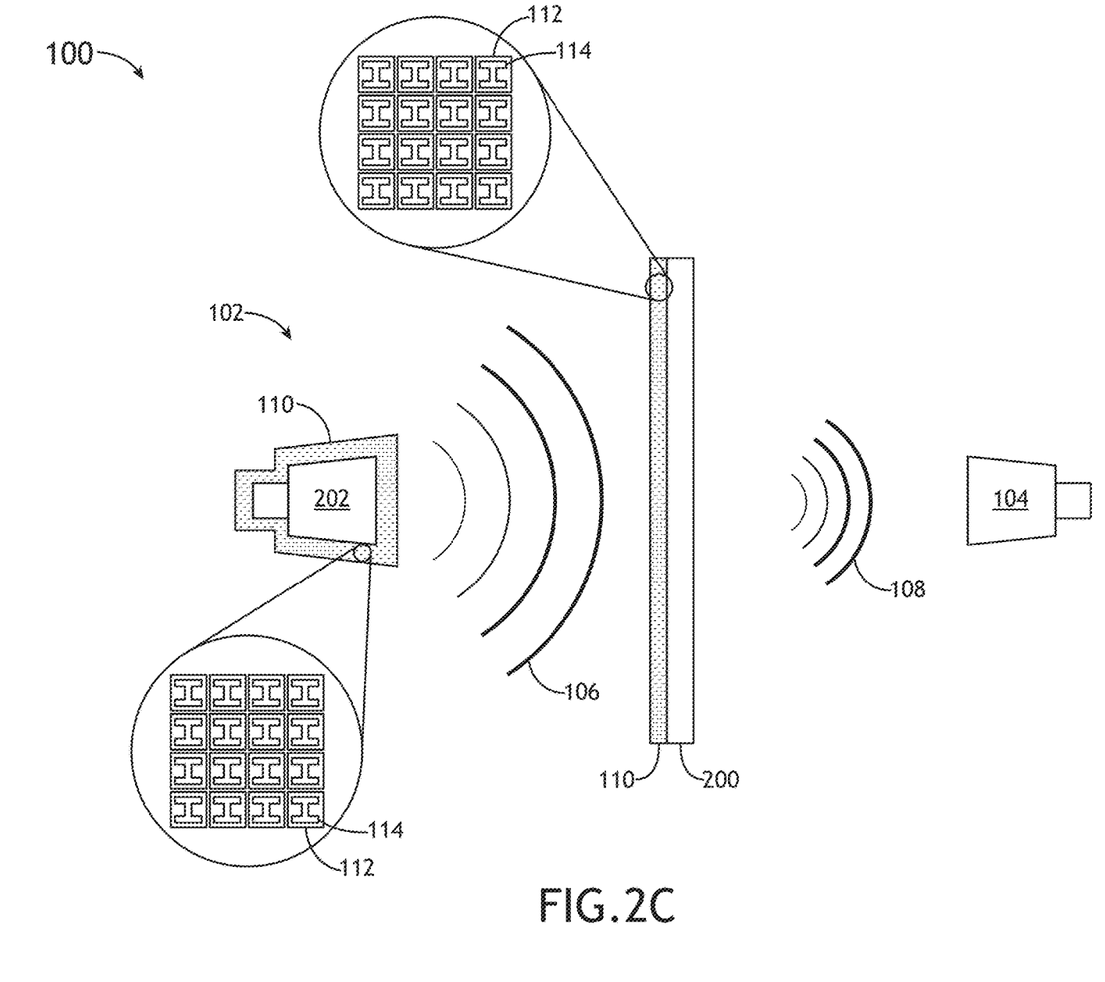
FIG. 2C is a simplified block diagram of a system for testing electromagnetic interference (EMI) emissions of a circuit card including a metamaterial absorber for shielding attenuation of EMI emissions, in accordance with one or more embodiments of the disclosure.

By way of another example, as illustrated in FIGS. 1C, 2C, and 3C, the shielding layer 110 may be within of the module 102, such that the module 102 at least partially encases or encompasses the shielding layer 110. For instance, the shielding layer 110 may be coupled to an interior surface of the main body 300, the sidewalls 302, and/or the lid 304 of the structure 200. In general, the shielding layer 110 may be, but is not limited to, a panel, placard, sticker, or other element configured to couple to a surface of the structure 200 and attenuate the EMI emission 106. The shielding layer 110 may be coupled via an adhesive, fasteners, soldering, or other coupling mechanism. In this regard, a designed and fabricated structure 200 of the module 102 may be retrofitted with the shielding layer 110 by a manufacturer and/or by a customer post-manufacturing.

Although embodiments of the disclosure describe the shielding layer 110 being coupled to a surface of the structure 200 of the module 102, it is noted herein the structure 200 of the module 102 may be fabricated at least in part from the shielding layer 110. In addition, it is noted herein the shielding layer 110 may be at least partially embedded within the structure 200 of the module 102. In this regard, a module 102 may be designed with the shielding layer 110 by a manufacturer and/or by a customer pre-manufacturing.

The system 100 may include one or more components 202 configured to emit the EMI emission 106. For example, the one or more components 202 may include, but are not limited to, one or more circuit cards 202 or printed circuit boards 202 (PCB 202) installed within the structure 200 of the one or more modules 102, one or more connectors of the one or more circuit cards 202 installed within the structure 200 of the one or more modules 102, one or more cables coupled to the one or more connectors of the one or more circuit cards 202 installed within the structure 200 of the one or more modules 102, or the like. It is noted herein the combination of the module 102 and the circuit card 202 or PCB 202 may be considered a module assembly, circuit card assembly, or PCB assembly, for purposes of the present disclosure.

As illustrated in FIGS. 3A-3D, a PCB 202 may include one or more PCB layers 306. In one example, where there are multiple PCB layers 306, the PCB layers 306 may be separated by a PCB dielectric layer 308. The PCB 202 may include one or more internal or embedded structures (i.e., internal PCB element 310). For example, one or more PCB vias 310 may be embedded within (e.g., pass through) the PCB dielectric layer 308, and may electrically couple the PCB layers 306 on either side of the PCB dielectric layer 308. For instance, the PCB layers 306 adjacent to the PCB dielectric layer 308 may be electrically coupled. In addition, a PCB via 310 may be embedded within (e.g., pass through) at least one of the PCB layers 306 adjacent to the PCB dielectric layer 308, such that non-adjacent PCB layers 306 may be electrically coupled.

The PCB 202 may include one or more external structures 312. For example, the one or more external structures 312 (i.e., internal PCB element 310) may include, but are not limited to, one or more external PCB passive devices 312 (e.g., resistors, or the like) or external active devices 312 (e.g., amplifiers, or the like). For example, the one or more PCB passive or active devices 312 may be coupled (e.g., physically and/or electrically) to a surface of the one or more PCB layers 306. For instance, the one or more external PCB passive or active devices 312 may be coupled to a power or ground plate or layer 314 on an exterior surface of a PCB layer 306. By way of another example, one or more PCB passive or active devices may be embedded within the PCB 202 (e.g., embedded within a PCB dielectric layer 308 or between a PCB layer 306 and the PCB dielectric layer 308).

A PCB 202 may be designed or retrofitted for electromagnetic compatibility (EMC) to dampen the EMI emission 106 emitted from internal PCB layers and/or internal vias and/or external PCB passive or active devices 312 embedded within the PCB 202 to a reduced EMI emission 108. For example, the reduced EMI emission 108 may be of a significant magnitude of difference in terms of signal strength as compared to the EMI emission 106. Attenuating the EMI emission 106 may include reflecting or absorbing at least a portion of the EMI emission 106 back into the PCB 202. For example, the reflecting or absorbing of the EMI emission 106 back at a source of the EMI emission 106 may cause anti- resonance and ultimately negation of the EMI emission 106.

Designing or retrofitting the PCB 202 for EMC may include adding one or more shielding layers 110 to the PCB 202. As illustrated in FIG. 2B, 2C, and 3C, the shielding layer 110 may be placed on an exterior of the PCB 202, such that the shielding layer 110 at least partially encases or encompasses the PCB 202. For example, the shielding layer 110 may be coupled to an exterior surface of the PCB 202 (e.g., on a surface of an exterior PCB layer of the PCB 202, or the like). In general, the shielding layer 110 may be, but is not limited to, a panel, placard, sticker, or other element configured to couple to a surface of the PCB 202 and attenuate the EMI emission 106. For example, the shielding layer 110 may be coupled via an adhesive, fasteners, soldering, or other coupling mechanism. In this regard, a designed and fabricated PCB 202 may be retrofitted with the shielding layer 110 by a manufacturer and/or by a customer post-manufacturing.

Although embodiments of the disclosure describe the shielding layer 110 being coupled to a surface of the PCB 202, it is noted herein the PCB 202 may be fabricated at least in part with the shielding layer 110. For example, the shielding layer 110 may replace a PCB layer of the PCB 202. By way of another example, the shielding layer 110 may be a PCB layer (e.g., a reference or ground layer 314) repurposed to attenuate the EMI emission 106 or given an additional purpose of attenuating the EMI emission 106 (e.g., in addition to operating as the reference or ground layer 314). In addition, it is noted herein the shielding layer 110 may be at least partially embedded within the PCB 202. For example, the shielding layer 110 may be positioned between PCB layers. In this regard, a PCB 202 may be designed with the shielding layer 110 by a manufacturer and/or by a customer pre-manufacturing.

Although embodiments of the disclosure illustrate the shielding layer 110 being simultaneously coupled to (or integrated with) the main body 300, the sidewalls 302, and/or the lid 304 of the structure 200 for purposes of attenuating the EMI emissions 106, it is noted herein the shielding layer 110 may be coupled to (or integrated with) only the main body 300, the sidewalls 302, or the lid 304 of the structure 200. For example, the shielding layer 110 may not be needed for the main body 300 and/or the sidewalls 302 where the shielding layer 110 is coupled to (or integrated with) the lid 304 and the EMI emission 106 is directed through the lid 304. Therefore, the above description should not be interpreted as a limitation on the scope of the present disclosure but merely an illustration.

Although embodiments of the disclosure illustrate the shielding layer 110 being simultaneously coupled to (or integrated with) the structure 200 and the PCB 202 for purposes of attenuating the EMI emissions 106, it is noted herein the shielding layer 110 may be coupled to (or integrated with) only the structure 200 or the PCB 202. For example, the shielding layer 110 may not be needed for the structure 200 where the shielding layer 110 is coupled to (or integrated with) the PCB 202. Therefore, the above description should not be interpreted as a limitation on the scope of the present disclosure but merely an illustration.

In one example embodiment as illustrated in FIGS. 1B, 1C, 2B, 2C, and 3A-3D, the shielding layer 110 may be a metamaterial absorber 110. The metamaterial absorber 110 may absorb at least a part of the EMI emission 106, acting as an EMI shield. For example, the EMI emission 106 emitted from inside the module 102 may be absorbed in part by the metamaterial absorber 110, attenuating the EMI emission 106 such that only the reduced EMI emission 108 is emitted. By way of another example, the metamaterial absorber 110 may be configured to cause anti-resonance and ultimately negation of the EMI emission 106.

The metamaterial absorber 110 may include any material known in the art to absorb at least part of the EMI emission 106 to reduce the EMI emission 106. The metamaterial absorber 110 may include assemblies of multiple elements 112 fabricated from composite materials including, but not limited to, metals or plastics. For example, the metamaterial absorber 110 may include, but is not limited to, graphene, copper, fiberglass, or a combination of materials. The elements 112 may be arranged in patterns (e.g., repeating or non-repeating patterns). For example, the patterns may be scaled smaller than the EMI emission 106 to be attenuated.

The elements 112 may include one or more adjustable fins 114. Configurations of the elements 112 and the contained one or more fins 114 including, but not limited to, shape, size, orientation, geometry, arrangement, or the like may attenuate at least a part of the EMI emission 106. The number and/or design of the adjustable fins 114 of the elements 112 may be determined based on the EMI emission 106, either through modelling, testing, simulations, iterative trial-and-error, or the like The metamaterial absorber 110 may be designed for an EMI emission 106 and/or tunable in response to the EMI emission 106, such that at least a part of the EMI emission 106 may be absorbed. The tuning of the one or more fins 114 may occur via circuitry installed within the module 102 and/or couplable to the module 102. For example, the circuitry may include, but is not limited to, filters, modulators, amplifiers, transistors, resonators. The circuitry may be manually tuned or automatically tuned via a controller (e.g., a controller coupled to the exterior component 104 measuring the EMI emissions 106) during the tuning process. The circuitry may be statically tuned (e.g., based on a measurement or a model of the EMI emission 106 prior to installation or after installation) or dynamically tuned (e.g., during the measurement of the EMI emission 106).

It is noted herein the structure 200 may represent the bulk or majority of the weight of the module 102. In addition, it is noted herein the structure 200 may be fabricated from a particular material of a select weight to shield against the EMI emission 106, including having a thicker top, bottom, and/or sides. Where the shielding layer 110 such as the metamaterial absorber is used, the structure 200 may be differently designed. For example, the thickness of the top, bottom, and/or sides of the structure 200 may be reduced. By way of another example, the type of material from which the structure 200 may be changed to a lighter material. In this regard, the weight of the module 102 may be reduced.

Figure 4:
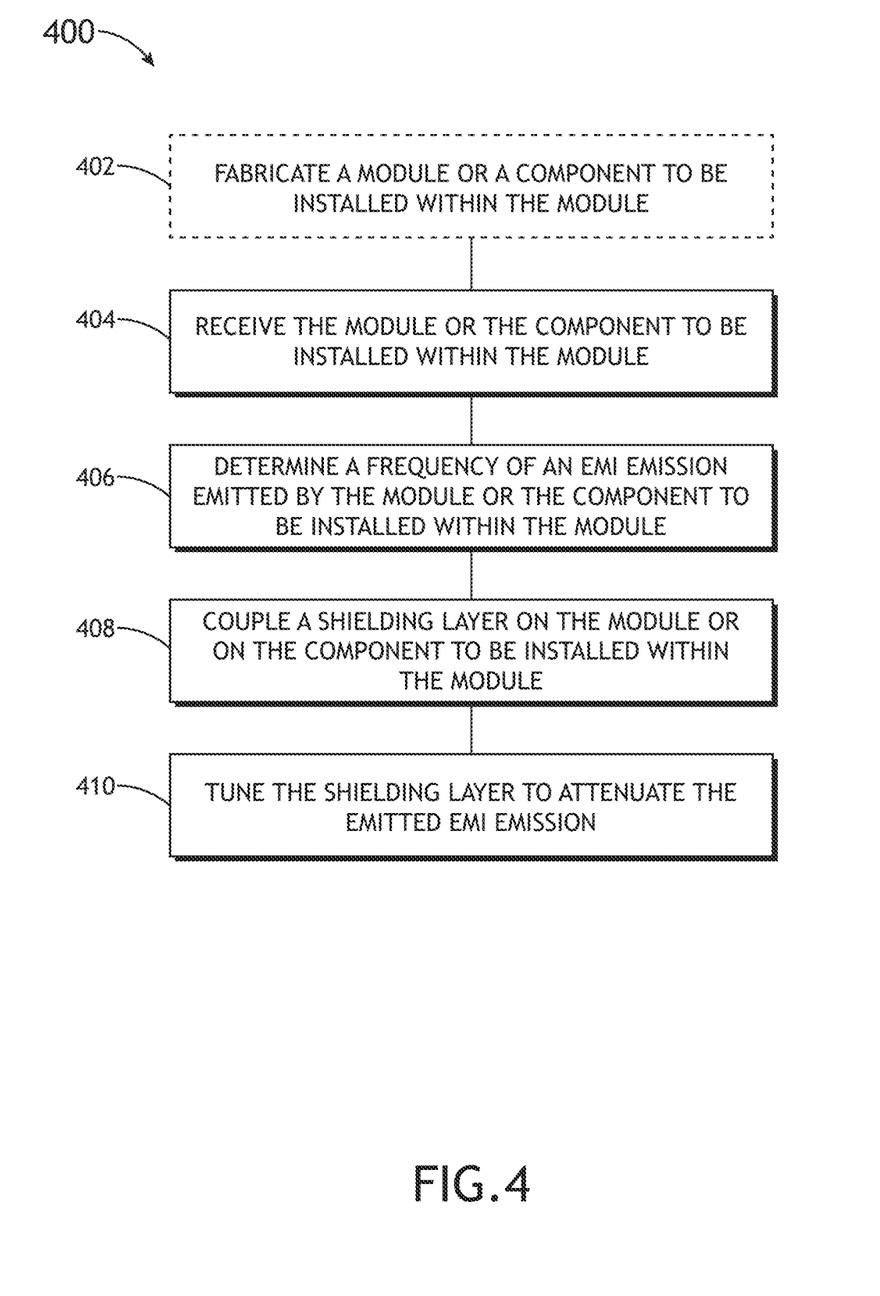
FIG. 4 is a flow diagram illustrating a method for shielding attenuation of EMI emissions.

FIG. 4 is a flow diagram illustrating a method 400 for shielding attenuation of module emissions, in accordance with one or more embodiments of the disclosure.

In a step 402, a module or a component to be installed within a module may be fabricated. The module 102 may include a structure 200. For example, the structure 200 may include the main body 300, the sidewalls 302, and/or the lid 304. The component 202 may include a PCB 202. In a step 404, the module or the component to be installed within the module may be received.

In a step 406, a frequency of an EMI emission emitted by the module or the component to be installed within the module may be determined. The EMI emission 106 may be emitted by the module 102 or by the component 202 to be installed within the module 102. The EMI emission 106 may be measured by a component 104 exterior to the module 102. For example, the exterior component 104 may include, but is not limited to, a network analyzer. A controller coupled to the network analyzer and/or circuity installed within and/or couplable to the module 102 may determine the frequency of the EMI emission 106.

In a step 408, a shielding layer may be coupled to the module or to the component installed within the module. The shielding layer 110 may include a metamaterial absorber. The shielding layer 110 may be coupled to an exterior surface of the structure 200 of the module 102. The shielding layer 110 may be coupled to an interior surface of the structure 200 of the module 102. The shielding layer 110 may be coupled to an exterior surface of the component 202.

It is noted herein the order of steps 406 and 408 may be performed in either order.

In a step 410, the shielding layer may be tuned to attenuate the emitted EMI emission. The tuning may be completed via the circuity installed within and/or couplable to the module 102. The tuning may be manual or automatic via a controller. The tuning may be static or dynamic. It is noted herein the tuning may occur prior to or after the coupling of the shielding layer 110 to the module 102 or to the component 202 installed within the module 102. For example, where the tuning occurs prior to the coupling of the shielding layer 110 to the module 102 or to the component 202 installed within the module 102, the reduced EMI emission 108 may be measured following the coupling to ensure the tuning is correct. By way of another example, where the tuning occurs after the coupling of the shielding layer 110 to the module 102 or to the component 202 installed within the module 102, the reduced EMI emission 108 may be measured periodically to ensure the tuning is correct.

It is noted herein step 402 may be optional. For example, a first party may fabricate the module 102 or the component 202 to be installed within the module 102 per step 402. By way of another example, a second party may receive the module 102 or the component 202 to be installed within the module 102, measure the EMI emission 106, couple the shielding layer 110, and tune the shielding layer 110 to attenuate the EMI emission 106 per steps 404, 406, 408, and 410. In addition, it is noted herein step 404 may be optional. For example, the same party may fabricate the module 102 or the component 202 to be installed within the module 102 per step 402, and may measure the EMI emission 106, couple the shielding layer 110, and tune the shielding layer 110 to attenuate the EMI emission 106 per steps 406, 408, and 410. Therefore, the above description should not be interpreted as a limitation on the scope of the present disclosure but merely an illustration.

Figure 5:
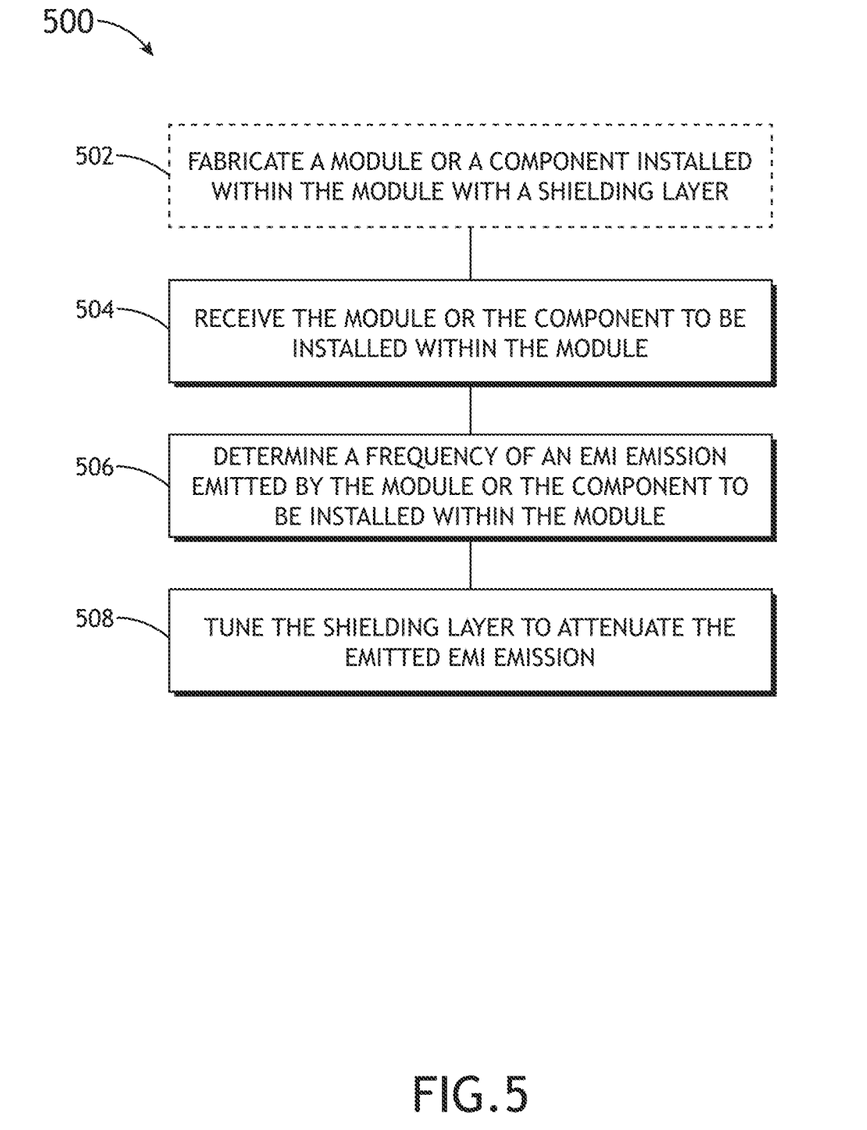
FIG. 5 is a flow diagram illustrating a method for shielding attenuation of EMI emissions.

FIG. 5 is a flow diagram illustrating a method 500 for shielding attenuation of module emissions, in accordance with one or more embodiments of the disclosure.

In a step 502, a module or one or more components to be installed within a module may be fabricated with a shielding layer. The module 102 may include a structure 200. For example, the structure 200 may include the main body 300, the sidewalls 302, and/or the lid 304. The component 202 may include a PCB 202. The shielding layer 110 may include a metamaterial absorber. The shielding layer 110 may be coupled to an exterior surface of the structure 200 of the module 102. The shielding layer 110 may be coupled to an interior surface of the structure 200 of the module 102. The shielding layer 110 may be coupled to an exterior surface of the component 202. In a step 504, the module or the component to be installed within the module may be received.

In a step 506, a frequency of an EMI emission emitted by the module or the component to be installed within the module may be determined. The EMI emission 106 may be emitted by the module 102 or by the component 202 to be installed within the module 102. The EMI emission 106 may be measured by a component 104 exterior to the module 102. For example, the exterior component 104 may include, but is not limited to, a network analyzer. A controller coupled to the network analyzer and/or circuity installed within and/or couplable to the module 102 may determine the frequency of the EMI emission 106.

In a step 508, the shielding layer may be tuned to attenuate the emitted EMI emission. The tuning may be completed via circuity installed within and/or couplable to the module 102. The tuning may be manual or automatic via a controller. The tuning may be static or dynamic. It is noted herein the tuning may occur prior to or after the coupling of the shielding layer 110 to the module 102 or to the component 202 installed within the module 102. For example, where the tuning occurs prior to the coupling of the shielding layer 110 to the module 102 or to the component 202 installed within the module 102, the reduced EMI emission 108 may be measured following the coupling to ensure the tuning is correct. By way of another example, where the tuning occurs after the coupling of the shielding layer 110 to the module 102 or to the component 202 installed within the module 102, the reduced EMI emission 108 may be measured periodically to ensure the tuning is correct.

It is noted herein step 502 may be optional. For example, a first party may fabricate the module 102 or the component 202 to be installed within the module 102 with the shielding layer 110 per step 502. By way of another example, a second party may receive the module 102 or the component 202 to be installed within the module 102, measure the EMI emission 106, and tune the shielding layer 110 to attenuate the EMI emission 106 per steps 504, 506, and 508. In addition, it is noted herein step 504 may be optional. For example, the same party may fabricate the module 102 or the component 202 to be installed within the module 102 with the shielding layer 110 per step 502, and may measure the EMI emission 106 and tune the shielding layer 110 to attenuate the EMI emission 106 per steps 506 and 508. Therefore, the above description should not be interpreted as a limitation on the scope of the present disclosure but merely an illustration.

It is noted herein the methods or processes 400 and 500 is not limited to the steps and/or sub-steps provided. The methods or processes 400 and 500 may include more or fewer steps and/or sub-steps. In addition, the methods or processes 400 and 500 may perform the steps and/or sub-steps simultaneously. Further, the methods or processes 400 and 500 may perform the steps and/or sub-steps sequentially, including in the order provided or an order other than provided. Therefore, the above description should not be interpreted as a limitation on the scope of the disclosure but merely an illustration.

In this regard, including a tunable shielding layer 110 fabricated from a metamaterial absorber may reduce the number of design constraints on the module 102 (e.g., on the structure 200 of the module 102 and/or on the components 202 including, but not limited to, a PCB 202 installed within the module 102). For example, the tunable shielding layer 110 fabricated from the metamaterial absorber may be the adjustment mechanism to attenuate emitted EMI signals 106 instead of needing to design the module 102 to be able to address emitted EMI emissions 106. In addition, including the tunable shielding layer 110 fabricated from the metamaterial absorber may allow for retrofitting of modules 102 and/or components 202 including, but not limited to, a PCB 202 installed within the module 102 instead of scrapping the module due to the emitted EMI emissions 106. Further, including a tunable shielding layer 110 fabricated from a metamaterial absorber may reduce the weight of the structure 200, as a necessary thickness of structure walls may be reduced and replaced with the attenuating or shielding properties of the tunable shielding layer 110 fabricated from the metamaterial absorber.

It is noted herein that one or more components of the system 100 may need to be configured in accordance with aviation guidelines and/or standards put forth by, but not limited to, the Federal Aviation Administration (FAA), the European Aviation Safety Agency (EASA) or any other flight certification agency or organization; the American National Standards Institute (ANSI), Aeronautical Radio, Incorporated (ARINC), or any other standards setting organization or company; the Radio Technical Commission for Aeronautics (RTCA) or any other guidelines agency or organization; or the like.

Although the disclosure been described with reference to the embodiments illustrated in the attached drawing figures, equivalents may be employed and substitutions made herein without departing from the scope of the claims. Components illustrated and described herein are merely examples of a system/device and components that may be used to implement embodiments of the disclosure and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A printed circuit board (PCB) module configured for shielding attenuation of an electromagnetic interference (EMI) emission, comprising:
   a PCB including at least one internal PCB element and at least one external PCB element, the at least one internal PCB element being embedded between adjacent layers of the PCB, the at least one external PCB element being coupled to an exterior surface of the PCB;
   a shielding layer fabricated from a tunable metamaterial absorber, the shielding layer being tuned in response to at least one measurement of the EMI emission and a determination of a frequency of the EMI emission from the at least one measurement, the tuning of the shielding layer including adjusting a plurality of fins within a plurality of elements of the metamaterial absorber, the tuned shielding layer being configured to absorb at least a portion of the EMI emission following the tuning of the shielding layer; and
   a structure housing the PCB.

2. The PCB module of claim 1, the metamaterial absorber being coupled to an exterior surface of the structure.

3. The PCB module of claim 2, the metamaterial absorber being tuned prior to being coupled to the exterior surface of the structure.

4. The PCB module of claim 2, the metamaterial absorber being tuned after being coupled to the exterior surface of the structure.

5. The PCB module of claim 2, the metamaterial absorber being coupled to the exterior surface of the structure during fabrication of the structure.

6. The PCB module of claim 1, the metamaterial absorber being coupled to an interior surface of the structure.

7. The PCB module of claim 6, the metamaterial absorber being tuned prior to being coupled to the interior surface of the structure.

8. The PCB module of claim 6, the metamaterial absorber being tuned after being coupled to the interior surface of the structure.

9. The PCB module of claim 6, the metamaterial absorber being coupled to the interior surface of the structure during fabrication of the structure.

10. The PCB module of claim 1, the metamaterial absorber being coupled to the exterior surface of the PCB.

11. The PCB module of claim 10, the metamaterial absorber being tuned prior to being coupled to the exterior surface of the PCB.

12. The PCB module of claim 10, the metamaterial absorber being tuned after being coupled to the exterior surface of the PCB.

13. The PCB module of claim 10, the metamaterial absorber being coupled to the exterior surface of the PCB during fabrication of the PCB.

14. A method, comprising:
   determining a frequency of an electromagnetic interference (EMI) emission emitted by a printed circuit board (PCB) module; and
   tuning a shielding layer of the PCB module to attenuate the emitted EMI emission, the shielding layer being fabricated from a tunable metamaterial absorber, the shielding layer being tuned in response to at least one measurement of the EMI emission and a determination of a frequency of the EMI emission from the at least one measurement, the tuning of the shielding layer including adjusting a plurality of fins within a plurality of elements of the metamaterial absorber, the tuned shielding layer being configured to absorb at least a portion of the EMI emission following the tuning of the shielding layer.

15. The method of claim 14, further comprising:
   coupling the shielding layer to the PCB module during fabrication of the PCB module.

* * * * *